(12) United States Patent
Haggard et al.

(10) Patent No.: US 7,147,107 B2
(45) Date of Patent: Dec. 12, 2006

(54) PACKAGING PLATFORM HAVING AN ADJUSTABLE THICKNESS

(75) Inventors: Clifton C. Haggard, Austin, TX (US); James R. Thomas, Austin, TX (US); Song Ping Chen, ShenZhen (CN); Ru Zheng Liu, ShenZhen (CN)

(73) Assignee: e.PAK International, Inc., Austin, TX (US)

( * ) Notice: Subject to any disclaimer, the term of this patent is extended or adjusted under 35 U.S.C. 154(b) by 59 days.

(21) Appl. No.: 10/386,398

(22) Filed: Mar. 11, 2003

(65) Prior Publication Data

US 2004/0178107 A1    Sep. 16, 2004

(51) Int. Cl.
B65D 85/30 (2006.01)
B65D 85/02 (2006.01)
B65D 21/00 (2006.01)

(52) U.S. Cl. .................. 206/710; 206/303; 206/454; 220/4.21; 220/4.27

(58) Field of Classification Search ............. 206/710, 206/303, 454; 220/4.21, 4.27; 248/188.2
See application file for complete search history.

(56) References Cited

U.S. PATENT DOCUMENTS

| | | | | |
|---|---|---|---|---|
| 3,672,495 A * | 6/1972 | Bauer et al. ............... 206/712 |
| 4,063,639 A * | 12/1977 | Grant ....................... 206/0.82 |
| 4,135,335 A * | 1/1979 | Jensen .................... 248/188.2 |
| 4,776,548 A * | 10/1988 | Bezenek ................. 248/188.2 |
| 4,886,162 A * | 12/1989 | Ambrogio .................. 206/710 |
| 5,427,233 A * | 6/1995 | Zinck et al. ............... 220/4.21 |
| 5,792,496 A * | 8/1998 | Fekete et al. .............. 220/4.21 |
| 5,815,992 A * | 10/1998 | Wells et al. ............. 248/188.2 |
| 6,193,068 B1 | 2/2001 | Lewis et al. |
| 6,230,446 B1 * | 5/2001 | Chalich .................. 248/188.2 |
| 6,234,316 B1 | 5/2001 | Hsieh et al. |
| 6,286,684 B1 | 9/2001 | Brooks et al. |
| 6,550,619 B1 * | 4/2003 | Bores et al. ............... 206/710 |
| 6,662,950 B1 * | 12/2003 | Cleaver ..................... 206/710 |
| 2003/0085139 A1* | 5/2003 | Loritz ..................... 206/308.1 |

FOREIGN PATENT DOCUMENTS

AU   A-44450/93   2/1994
JP   2004-136924  5/2004

* cited by examiner

Primary Examiner—Byron P. Gehman
(74) Attorney, Agent, or Firm—Carlson, Gaskey & Olds

(57) ABSTRACT

A platform (40) has a rigid body with an adjustable thickness (t) to selectively occupy any remaining space within a container (20) used for packaging items such as semiconductor wafers (22). The platform (40) in one example has a first portion (42) and a second portion (44). Adjusting the positions of the first and second portions (42, 44) relative to each other selectively varies the thickness (t) of the platform (40) to achieve the desired thickness.

19 Claims, 2 Drawing Sheets

PACKAGING PLATFORM HAVING AN ADJUSTABLE THICKNESS

FIELD OF THE INVENTION

This invention generally relates to fillers for use in packaging delicate items such as semiconductor wafers. More particularly, this invention relates to a platform that has a selectively variable thickness to fill a space within a container.

DESCRIPTION OF THE RELATED ART

A variety of containers are used for packaging items such as semiconductor wafers. Extreme care must be exercised when handling such items because of their delicate nature. In the case of semiconductor wafers, the silicon structure is very fragile. Various approaches have been taken to ensure the integrity of the semiconductor wafers within such packages.

A typical package or container has a top and a bottom that are selectively secured together. A wafer restraining portion within which the wafers are held during handling and shipping, for example, extends between the top and the bottom. Individual wafers placed adjacent each other typically are separated by an appropriate sheet of material as known. The conventional approach is to use foam disk pads at the ends of a stack of wafers to provide cushion for the wafers in the container. Sometimes the foam disk pads are inserted between wafers within a stack.

While foam and inserts do provide cushion, there are drawbacks and shortcomings associated with their use. Difficulties arise when the wafers are not securely maintained within the package. The wafer restraining portion typically has an inside dimension that is greater than an outside dimension of the wafers. Accordingly, there is the possibility for lateral movement of the wafers relative to each other during handling or shipping. Such lateral movement damages the wafers and often renders the circuitry supported on the wafers useless.

There is an increased likelihood for lateral wafer movement in many typical container assemblies where a plurality of foam disk inserts are used at one end of the stack of wafers to fill any remaining space within the container after the desired number of wafers have been inserted into the container. Using additional layers of foam on one side of the wafer stack provides an uneven distribution of cushion on opposite sides of the wafer stack. Uneven cushion leaves the possibility for additional lateral movement and damage to the wafers.

There is a need for an improved way of packaging items such as semiconductor wafers to protect the items from damage during shipping and handling. This invention addresses that need by providing a unique platform for selectively filling any remaining space within a container after a desired number of items have been placed within the container.

SUMMARY OF THE INVENTION

In general terms, this invention is a platform for use in packaging items such as semiconductor wafers. The platform has a rigid body with a selectively variable thickness. By varying the thickness of the platform, any space remaining within a container after the desired number of items have been placed within the container is accurately and securely filled, which minimizes any lateral movement of the items within the container. The inventive platform has the significant advantage of allowing for equal cushion distribution on opposite sides of a stack of wafers within the container.

In one example, the rigid body of the platform includes a first portion and a second portion. Selectively positioning the first portion relative to the second portion sets the thickness of the platform to fill the desired amount of space within a container.

In one example, the first and second portions are generally cylindrical and an adjustment feature allows for selectively positioning the first portion relative to the second portion. In one example, a plurality of detents on positioning surfaces on the first and second portions cooperate to prevent the first and second portions from moving relative to each other in at least one direction. In one example, the detents on the positioning surfaces prevent the first portion from moving toward the second portion once the desired thickness is set. The endwalls of the container within which the platform is placed cooperate to prevent the first and second portions from moving apart.

The various features and advantages of this invention will become apparent to those skilled in the art from the following detailed description of the currently preferred embodiment. The drawings that accompany the detailed description can be briefly described as follows.

DETAILED DESCRIPTION OF THE PREFERRED EMBODIMENTS

Figure 1:
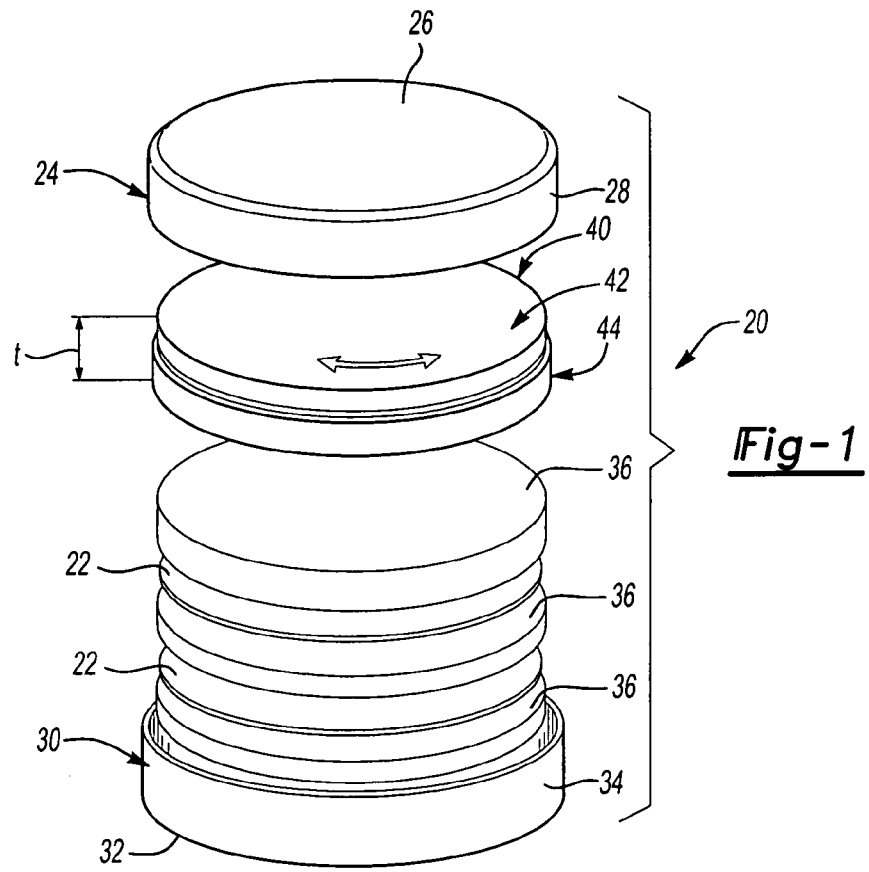
FIG. 1 is a diagrammatic, exploded, perspective illustration of a container including a platform designed according to this invention.

FIG. 1 diagrammatically shows a container 20 for packaging items 22 such as semiconductor wafers. The container 20 includes a top 24 having an endwall 26 and a side wall 28. The container 20 also includes a bottom 30 having an endwall 32 and a side wall 34. The sidewalls 28 and 34 establish a wafer restraining portion of the container between the endwalls 26 and 32. The top 24 and bottom 30 are secured together in a conventional manner to provide a container for holding the wafers 22 for shipping and handling purposes.

In the illustrated example, a plurality of cushion members 36 are provided to cushion the wafers 22 within the container 20. At least one cushion member 36 is placed at each end of the stack of the wafers 22. In the illustrated example, a cushion 36 is placed at an intermediate position within the stack of wafers 22.

The container 20 is designed with a capacity that exceeds many stacks of wafers 22, even when combined with the cushion members 36. The inventive arrangement includes a platform 40 that has an adjustable thickness t for filling any remaining space between the combined stack of wafers 22 with the cushion members 36 and the endwalls 26 and 32 within the container 20. In other words, the distance between the endwalls 26 and 32 may be greater than the total thickness of the stack of wafers 22 and cushion members 36. The platform 40 extends across any difference between the distance between the endwalls 26 and 32 and the combined stack of wafers 22 and cushion members 36.

The inventive platform 40 preferably is rigid so that it is noncompressible and withstands typical forces expected to be exerted upon the container 20 during shipping or handling of the wafers 22. Because the platform 40 is rigid and has an adjustable thickness t, any remaining space within the container 20 is completely and securely compensated for by the platform 40 in a manner that eliminates any lateral movement of the wafers 22 while in the package 20.

Another significant advantage of having a rigid platform 40 is that it allows for placing an equal number of cushion members 36 on opposite ends of the stack of wafers 22 (instead of filling any remaining space with additional cushion members 36 on one side of the stack). Because the platform 40 is rigid, equal cushion is possible on both sides of the wafer stack. With prior arrangements where multiple cushion members would be placed at one end of the stack to fill remaining space within the container, unequal cushion resulted at opposite ends of the wafer stack. Such unequal cushion introduces the possibility for undesirable wafer movement and breakage during shipping or handling, for example.

In the illustrated example, the platform 40 has a first portion 42 and a second portion 44. By adjusting relative positions of the first portion 42 and the second portion 44, the thickness t is selectively adjusted so that the platform 40 takes up the desired amount of space within the container 20.

Figure 2:
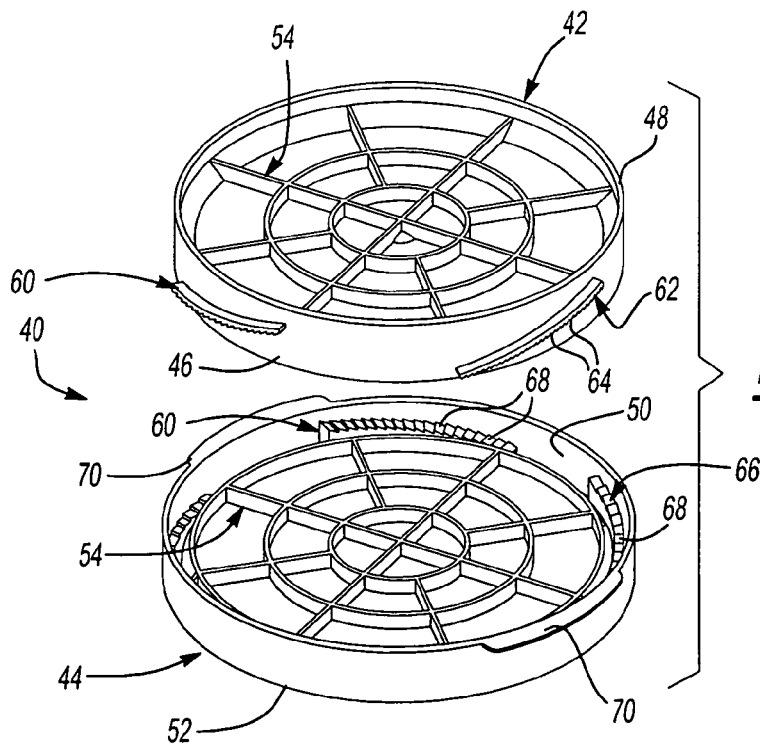
FIG. 2 is a perspective, exploded view of an example embodiment of a platform designed according to this invention.
Figure 3:
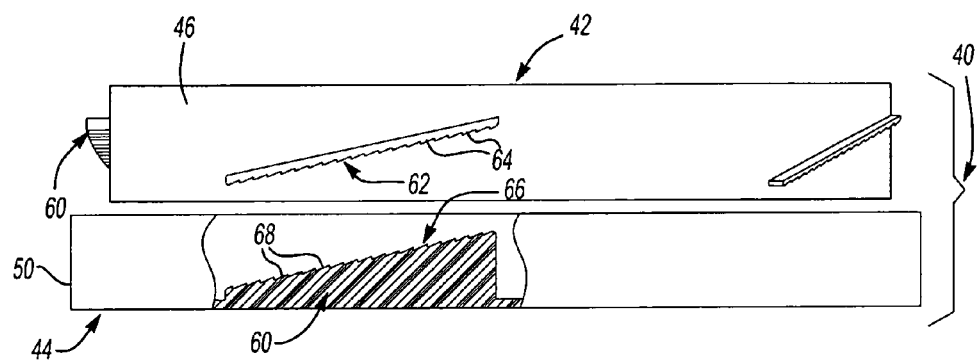
FIG. 3 schematically illustrates selected portions of the embodiment of FIG. 2 with the first portion separated from the second portion.

FIG. 2 schematically illustrates one example embodiment of a platform 40 designed according to this invention. In this example, the first portion 42 is at least partially cylindrical and has a side wall 46. In this example, an end 48 of the side wall 46 is adapted to engage an inner surface of the endwall 26 of the container top 24.

The second portion 44 in this example is at least partially cylindrical and has a side wall 50 and an end surface 52. In this example, the end surface 52 is adapted to be received against the outermost cushion member 36 of the wafer stack.

The first and second portions 42 and 44 in one example are made from a plastic material so that the side walls 46 and 50 are rigid and noncompressible. In the illustrated example, a web reinforcing portion 54 is provided on each of the first portion 42 and the second portion 44 to provide further rigidity to the body of the platform 40.

In one example, an electrically inert plastic is used to minimize any static within the container 20 that may otherwise adversely affect the wafers 22.

An adjustment feature 60 allows for selectively positioning the first portion 42 relative to the second portion 44 so that the distance between the end surface 48 and the end surface 52 can be adjusted to achieve the desired thickness t of the platform 40. In this example, the adjustment feature 60 includes angled positioning surfaces on each of the first portion 42 and second portion 44. The first portion 42 includes a positioning surface 62 having a plurality of detents 64. A correspondingly angled positioning surface 66 on the second portion 44 includes a plurality of detents 68. The detents 64 and 68 cooperate to prevent relative movement between the first portion 42 and the second portion 44 in a direction that would result in a change in the thickness of the platform 40. In this example, the detents 64 and 68 cooperate to prevent relative movement between the first portion 42 and the second portion 44 in a direction that would decrease the thickness t of the platform 40. Because the platform 40 is secured within a closed container 20, the endwalls 26 and 32 cooperate to prevent the first and second portions of the platform 40 from separating (i.e., prevent the thickness t from increasing).

In the illustrated example, the positioning surfaces 62 and 66 are at an angle of approximately 12° relative to the plane of the end surface 52 of the second portion 44, for example. Each detent 64 or 68 includes an angled surface and a stop surface as can be appreciated from the drawings. In one example, the angled surface is approximately 11.5° relative to the angled positioning surface. The stop surface is at an angle of approximately 84° relative to the angled surface of the detent.

The positioning surfaces 62 and 66 preferably extend around at least portions of the periphery of the first portion 42 and second portion 44. In this example, the first portion 42 is at least partially received within the second portion 44. By selectively rotating the first portion relative to the second portion, the thickness t may be adjusted.

Figure 4:
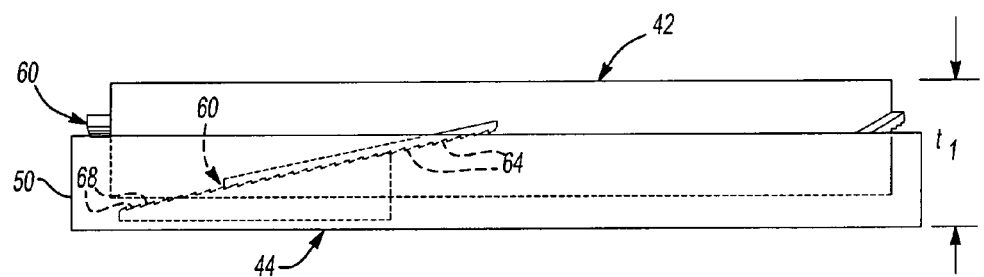
FIG. 4 schematically illustrates the embodiment of FIG. 3 with the first and second portions adjusted to establish a first thickness $t_1$.
Figure 5:
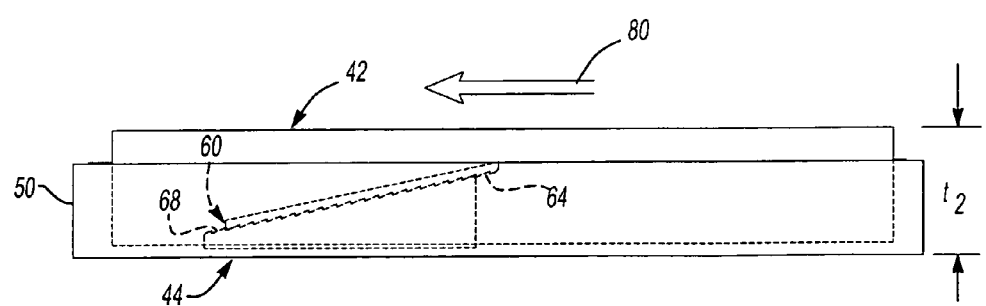
FIG. 5 schematically illustrates the embodiment of FIG. 3 with the first and second portions adjusted to establish a second thickness $t_2$.

As shown in FIG. 4, a thickness $t_1$ corresponds to a first relative position of the first portion 42 relative to the second portion 44. Rotating the first portion relative to the second from that position, as schematically shown by the arrow 80 in FIG. 5, a smaller thickness $t_2$ is achievable. The detents 64 and 68 cooperate to maintain the first portion 42 relative to the second portion 44 in the desired position to establish the desired thickness.

According to one use of the inventive platform, the container 20 is filled with the desired number of wafers 22 and cushion members 36. The platform 40 is then placed within the container 20 on top of the stack of wafers and cushion members. The relative positions of the first portion 42 and second portion 44 then are adjusted to establish the desired thickness t of the platform 40. The chosen thickness preferably extends across the remaining space within the container 20 after the stack of wafers and cushion members are in position. Once the top 24 is secured to the bottom 30, the platform 40 securely positions the stack of wafers 22 in place within the container 20 so that lateral or axial movement of the wafers 22 is minimized. Additionally, the platform 40 establishes equal cushion distribution on opposite ends of the wafer stack when the same amount of cushion members 36 are provided on opposite sides of the wafer stack.

The inventive platform provides a more secure containment of items such as semiconductor wafers within a container. The rigid platform body having an adjustable thickness provides the advantages mentioned above in a manner that efficiently and economically accommodates a variety of container styles.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A packaging platform for use in packaging items, comprising:

first and second rigid, generally cylindrical portions, each of the first and second portions having an end surface and including at least one positioning surface at an oblique angle to a corresponding one of the end surfaces, the at least one positioning surface on at least the first portion including a plurality of stop surfaces along the at least one positioning surface that cooperate with at least one stop surface on the at least one positioning surface on the second portion for establishing a selected one of a plurality of thicknesses of the platform and preventing the first and second portions from moving relative to each other in a direction that would reduce the selected thickness.

2. The platform of claim 1, wherein each of the plurality of stop surfaces corresponds to each of the plurality of thicknesses.

3. The platform of claim 1, wherein one of the first portion or the second portion is at least partially received within the other portion.

4. The platform of claim 1, wherein the thickness of the platform is selectively varied using relative rotation between the first and second portions.

5. The platform of claim 1, including a plurality of stop surfaces on each of the positioning surfaces.

6. The platform of claim 1, wherein the first and second portions comprise opaque plastic.

7. The platform of claim 1, wherein at least one of the end surfaces has a web of a plurality of reinforcing members extending across the at least one of the end surfaces for preventing the at least one of the end surfaces from moving in a direction toward the other end surface.

8. A container assembly, comprising:
   a container having a first endwall facing toward an interior of the container, a second endwall facing toward the first endwall and at least one sidewall between the first and second endwalls such that the endwalls and the at least one sidewall define a closed interior of the container;
   at least one semiconductor wafer received within the interior of the container; and
   a platform independent of and separate from the endwalls and received within the interior of the container between the at least one semiconductor wafer and one of the endwalls, the platform having first and second rigid portions that cooperate to establish a selectively variable platform thickness to extend across a selected distance within the interior of the container.

9. The container of claim 8, wherein the platform comprises opaque plastic.

10. The container of claim 8, wherein at least one end surface of the platform has a web of a plurality of reinforcing members extending across the at least one end surface for preventing the at least one end surface from moving in a direction toward an opposite end surface.

11. A container assembly, comprising:
    a container having a first endwall facing toward an interior of the container, a second endwall facing toward the first endwall and at least one sidewall between the first and second endwalls such that the endwalls and the at least one sidewall define a closed interior of the container;
    at least one semiconductor wafer received within the interior of the container;
    a platform received within the interior of the container between the semiconductor wafer and one of the endwalls, the platform having a selectively variable thickness to extend across a selected distance within the interior of the container; and
    wherein the platform comprises two rigid portions each having an end surface and a solid sidewall portion supporting a positioning surface that cooperates with a positioning surface on the other portion, at least one positioning surface including a plurality of stop surfaces to prevent the end surfaces from moving closer together from each of a corresponding plurality of selectable spacings between the end surfaces and wherein the first and second endwalls of the container cooperate to prevent the platform end surfaces from moving farther apart when the container is closed.

12. The container of claim 11, wherein the positioning surfaces are at least partially at an oblique angle relative to the end surfaces.

13. The container of claim 11, wherein one of the platform portions is at least partially received within the other portion.

14. The container of claim 11, wherein the platform portions are at least partially cylindrical and wherein the thickness of the platform is selectable by rotating at least one of the portions relative to the other.

15. The container of claim 11, wherein each positioning surface includes a plurality of stop surfaces.

16. A method of packing at least one semiconductor wafer, comprising the steps of:
    placing at least one semiconductor wafer within a container having opposite and inwardly facing endwalls and at least one sidewall extending between the endwalls such that the endwalls and the at least one sidewall define a closed interior container cavity;
    filling a remaining space within the closed interior container cavity with a platform by selectively adjusting a thickness of the platform to correspond to the remaining space, wherein the platform comprises first and second rigid portions that are at least partially cylindrical and including rotating the first portion relative to the second portion to thereby adjust the thickness of the platform.

17. A method of packing at least one semiconductor wafer, comprising the steps of:
    providing a container having opposite and inwardly facing endwalls and a sidewall extending between the endwalls such that the endwalls and the sidewall establish a closed interior container cavity;
    providing a platform that is separate from and independent of the container and comprises first and second rigid portions;
    placing at least one semiconductor wafer within the container; and
    filling a remaining space within the cavity with the platform by adjusting a position of the first portion relative to the second portion to thereby adjust a thickness of the platform to correspond to the remaining space.

18. The method of claim 17, comprising providing approximately equal amounts of cushion on opposite sides of the at least one semiconductor wafer within the closed interior container cavity.

19. A packaging platform for use in packaging items, comprising:
    first and second rigid portions, each of the first and second portions including
       an end surface;
       at least one sidewall generally perpendicular to the end surface and establishing an exterior dimension of the corresponding portion, and
       at least one positioning surface at an oblique angle to a corresponding one of the end surfaces,
    the at least one positioning surface of at least the first portion is on the at least one sidewall of the first portion and includes a plurality of stop surfaces along the at least one positioning surface that cooperate with at least one stop surface on the at least one positioning surface on the second portion for establishing a selected one of a plurality of thicknesses of the platform and preventing the first and second portions from moving relative to each other in a direction that would reduce the selected thickness.

* * * * *